(12) United States Patent
Kuzmenka

(10) Patent No.: US 7,186,922 B2
(45) Date of Patent: Mar. 6, 2007

(54) CIRCUIT BOARD

(75) Inventor: Maksim Kuzmenka, Munich (DE)

(73) Assignee: Infineon Technologies AG, Munich (DE)

( * ) Notice: Subject to any disclaimer, the term of this patent is extended or adjusted under 35 U.S.C. 154(b) by 372 days.

(21) Appl. No.: 10/833,948

(22) Filed: Apr. 28, 2004

(65) Prior Publication Data

US 2005/0241849 A1    Nov. 3, 2005

(51) Int. Cl.
*H05K 1/03* (2006.01)
(52) U.S. Cl. ...................... 174/256; 174/258
(58) Field of Classification Search ............... 174/256, 174/258
See application file for complete search history.

(56) References Cited

U.S. PATENT DOCUMENTS 5,355,283 A * 10/1994 Marrs et al. ................ 361/760
6,621,377 B2 * 9/2003 Osadchy et al. ............ 333/161
2005/0051357 A1 * 3/2005 Wallace
2005/0201072 A1 * 9/2005 He et al.
2005/0241850 A1 * 11/2005 Cannon et al.

* cited by examiner

*Primary Examiner*—Dean A. Reichard
*Assistant Examiner*—Yuriy Semenenko
(74) *Attorney, Agent, or Firm*—Slater & Matsil, L.L.P.

(57) ABSTRACT

To provide a circuit board with improved electrical features with respect to a synchronization of signals, a circuit board comprises a dielectric substrate and a trace extending along a surface of the dielectric substrate, the trace having a first and second portion, the trace being covered by a first medium at the first portion, wherein the first medium is formed by an encapsulation element of a dielectric material so that the effective dielectric constant of the first medium is different from the effective dielectric constant of a medium extending over the trace at the second portion. Thus, a propagation speed difference can be created, when a signal travels along the first portion of the trace with respect to a signal propagation speed of a signal traveling along the second portion of the trace.

22 Claims, 3 Drawing Sheets

CIRCUIT BOARD

BACKGROUND OF THE INVENTION

1. Field of the Invention

The present invention refers to a circuit board, especially to a circuit board with an improved timing characteristics of different signals in a data bus.

2. Description of Prior Art

Often it is a topological problem in computer technology, especially in computer subsystems and other devices to distribute a signal via a wide data bus from a first unit with very small pin pitch and/or dimensions to a second unit with a larger pin pitch and/or dimensions. Especially when the first unit is, for example, a processor, controller or the like and the second unit is, for example, a row of connectors, both being arranged on a circuit board, such a problem arises as the pins of the first unit has a small pin pitch and the second unit has a much larger pin pitch as to securely and tightly connect the row of connectors. FIG. 4 shows such an arrangement in which a controller with five pins (denominated c1, c2, c3, c4 and c5) has to be connected to a DIMM memory module also with five pins (denominated 1d, 2d, 3d, 4d and 5d). For the reason of simplicity only five lines are shown in FIG. 4, nevertheless a bus connecting the controller to the DIMM can comprise more than five lines as for example 64 data bus lines for 64 bits. Herein the memory controller has for example dimensions of approximately 25×25 mm and the memory controller should be connected via the 5 (respectively 64) bit wide data bus to the DIMM memory module there arises a problem in view of signal synchronization when the DIMM memory module is, for example, 135 mm long as roughly outlined by the vertical extension of the DIMM memory module in FIG. 4 in contrast to the dimensions of the controller. On the one hand, from synchronization point of view, delay in each bit line between the controller and the DIMM must be the same to provide an synchronous switching data transmission operation. On the other hand, this is very difficult to realize since, for example, pin c3 of the controller has a direct length to a pin 3d of the DIMM which is obviously shorter than a direct connection from pin c1 of the controller to pin 1d of the DIMM. In order to overcome this problem, conventional techniques use meandering structures to "artificially" enlarge the length of data bus lines for connections between pins of the data bus being located closer to each other than other pins of the data bus. In FIG. 4 such a meandering structure can be seen in the line connecting pin c3 of the controller with pin 3d of the DIMM. Furthermore, a connection between pin c2 of the controller to pin 2d of the DIMM as well as a connection of pin c4 of the controller to pin 4d of the DIMM also have meandering structures. However, the summary length of the meandered line is not that large as the amplitude of the meanders in the line connecting pin c3 of the controller to pin 3d of the DIMM as the distance between pin c2 of the controller to pin 2d of the DIMM is larger than the distance of pin c3 of the controller and pin 3d of the DIMM. As can be seen in FIG. 4 the connection line between pin c1 of the controller to pin 1d of the DIMM as well as the connection line between pin c5 of the controller to pin 5d of the DIMM has no meanders. By providing such a meandering structure in a data bus system, a synchronization of the signals outputted from the controller can be realized, such that the signals arrive at the pins of the DIMM exactly at the same time and thus compensating runtime differences among connection lines of the different pins of the controller and the DIMM.

However, if a distance from the controller to the DIMM is small, then the central area between the controller and the DIMM will be occupied by trace serpentines (or meanders) and only traces on the edges of the bus will not have a meander structure. This can be clearly seen in FIG. 4 as the space 402 between the controller and the DIMM in the range of pins c2 and c4 of the controller and pins 2d to 4d of the DIMM is nearly completely filled with meander structures. As can be seen in FIG. 4, such meander structures require several iterations of the routing, and still consumes too much of area. In some cases additional PCB layers are required. However, even now such structures are routed manually in 90% of the cases.

Thus, as to improve routing characteristics for a memory data bus, a bus being 64 bits wide is usually divided by groups of 8, and timing as well as synchronization/length matching is done only inside this small groups and therefore the routing of the small group of traces can be carried out more easily with said meander structures. For a trace length matching a meandering structure is used normally.

SUMMARY OF THE INVENTION

In one aspect, the present invention provides a circuit board which may be designed smaller.

The preferred embodiment of the present invention provides a circuit board comprising a ground or supply conducting plane, or a dielectric substrate and a trace extending along a surface of the dielectric substrate, the trace having a first and a second portion, the trace being covered by a first medium at the first portion, wherein the first medium is formed by an encapsulation element of a dielectric material so that an effective dielectric constant of the first medium is different from an effective dielectric constant of a second medium extending over the trace at the second portion.

The preferred embodiment is based on the knowledge that a propagation speed of a signal can be reduced when a first portion of the trace is covered by the encapsulation element formed of a medium with a first effective dielectric constant and a medium with a second effective dielectric constant extending over the second portion of the trace, wherein the first effective dielectric constant is different from the second effective dielectric constant. Furthermore, by varying a length of the first portion of the trace covered by the encapsulation element, it is possible to vary the delay time of a signal propagating along the trace by a predetermined amount. Therefore, by choosing an adequate length of the first portion of the trace, i.e. an adequate length of the encapsulation element covering the first portion of the trace, a definite delay of the signal propagating along the trace is enabled. As the dielectric constants of the substrate and the cover could be the same or different as well, the effective dielectric constant, which may be different from the dielectric constant of the substrate or the cover, is the relevant parameter for propagation delays on the line. Furthermore, an effective dielectric constant in the relevant vicinity of the trace results, for example, when a trace is in contact with layers with different $\epsilon$. However, even changes of geometry have an influence on the effective dielectric constant, as, for example, a thin cover layer will increase the dielectric constant more than a thick one.

It is an advantage of embodiments of the present invention that it is possible to provide definite signal delay times without using area consuming meandering structures. To provide this definite delay time only an encapsulation element covering the first portion of the trace can be used wherein by a definite length of the encapsulation element, i.e. by a definite length of the first portion of the trace, a definite signal delay can be imposed on the trace. Furthermore, the present invention provides an easier routing of the traces as the area consuming meandering structures can be omitted.

According to a second aspect, the width of the first portion of the trace is smaller than a width of the second portion of the trace. Using this difference in the width of the first portion and the second portion of the trace it is possible to avoid signal reflections which possibly occur due to the stepwise transition of the effective dielectric constants (and as consequence step of the characteristic impedance of the trace) of the medium around the second portion of the trace to the effective dielectric constant of the material forming the encapsulation element covering the first portion of the trace.

According to a further aspect of the present invention the effective dielectric constant of the first medium is substantially equal to the effective dielectric constant of the dielectric substrate. Therefore it is possible that the first portion of the trace is completely surrounded by a material having nearly the same effective dielectric constant which results in a homogeneous electrical flow through the first portion of the trace. Therefore the electrical behavior of a signal propagating along the first portion of the trace can be determined more easily as if materials having different effective dielectric constants are positioned around the first portion of the trace.

According to a further aspect of the present invention the first medium and the second medium are located on a side of the trace being opposite to the surface of the dielectric substrate. Therefore, it is an advantage of the present invention that the first medium, which forms the encapsulation element, can be easily arranged on the surface of the dielectric substrate. Therefore, it is possible to use a low-cost production method for providing the first medium, i.e. the encapsulation element, and the second medium on the circuit board.

According to a further aspect of the present invention, the second medium comprises gas in the environment of the circuit board. This provides the advantage that quite no effort has to be taken for extending the second medium over the second portion of the trace as for example normal air can be used as the second medium on the second portion of the trace.

According to a further aspect of the present invention, a height of the encapsulation element above the first portion of the trace is at least the same as a height of a dielectric plane between the trace and a ground plane or a supply plane, which is typically 0.1 mm. Choosing a height of the encapsulation element being higher than this plays a secondary role in changing of effective $\epsilon$. However, the encapsulation element can be made more robust by choosing a height being above the height between the trace and the ground or supply plane.

According to a further aspect of the present invention, the circuit board further comprises a second trace extending along the surface of the dielectric substrate, the second trace having a first and a second portion, the first portion of the second trace being covered by a second encapsulation element wherein the second encapsulation element comprises a medium with an effective dielectric constant being different from the effective dielectric constant of a medium extending over the second portion of the second trace. It is an advantage of a thus arranged circuit board that it provides the possibility to delay a signal propagating along the trace and as well delaying a signal propagating along the second trace. Therefore, a distinct delay such as no delay of the signals propagating along the trace and the second trace can be established by an adequate choice of the length of the first portions of the first and second traces as well as an adequate choice of the effective dielectric constants of the encapsulation elements covering the first portion of the first and second trace.

According to a further aspect of the present invention the second encapsulation element is a portion of the encapsulation element formed by the first medium. It is an advantage of a thus formed second encapsulation element, that it can be easily constructed when providing the encapsulation element formed by the first medium.

According to a further aspect of the present invention a length of the first portion of the trace is different from a length of the first portion of the second trace. Therefore, it is an advantage of a thus constructed circuit board that a delay of a signal propagating along the trace can be different from a delay of a further signal propagating along the second trace.

According to a further aspect of the present patent application, the length of the trace is shorter than the length of the second trace and the length of the first portion of the trace is larger than the length of the first portion of the second trace. A thus constructed circuit board provides the advantage, that a signal propagating along the trace is more delayed than a signal propagating along the second trace. This can be especially realized, if the effective dielectric constant of the encapsulation element on the trace and the encapsulation element of the second trace are higher than an effective dielectric constant of a medium extending over the second portions of the trace and the second trace. Therefore, a larger signal delay can be realized for a signal propagating along the trace in contrast to a signal delay of a signal propagating along the second trace. If the second trace is longer than the trace, by a thus constructed circuit board it is possible to adjust the delay times of the signals such that a total propagation time of the first signal propagating along the trace is equivalent to a propagation time of the second signal propagating along the second trace. Therefore, it is possible to provide an adjustment of timing or synchronization aspects to the length of first and second traces, the signals propagate on.

According to a further aspect of the present patent application a first terminal of a first electronic component is connected via the trace with a first terminal of a second electronic component and the second terminal of the second electronic component is connected via the second trace with a second terminal of the second electronic component. A thus arranged circuit board provides the advantage that the timing or synchronization requirement of the first electronic component and the second electronic component can be easily adjusted without having to consider different trace lengths.

According to another aspect of the present invention the circuit board comprises a third trace extending along the surface of the dielectric substrate, the third trace having a first and a second portion, the first potion of the third trace being covered by a third encapsulation element wherein the third encapsulation element comprises a medium of an effective dielectric constant being different from the effective dielectric constant of a medium extending over the second portion of the third trace. Additionally the third encapsulation element can be formed as a portion of the encapsulation element formed by the first medium. It is an advantage of a thus constructed circuit board that it provides an easily producible encapsulation element as the encapsulation element for example can be provided by just one single element to be fixed on the surface of the printed circuit board.

According to a further aspect of the present invention a length of the first portion of the trace is larger than the length of the first portion of the third trace and wherein the first portion of the trace is located in between the first portion of the second trace and the first portion of the third trace. According to a further aspect of the present patent application the encapsulation element has the form of a convex lens. It is an advantage of a thus constructed circuit board that the encapsulation element can be easily constructed, for example in one pre-assembled element, and thus production costs of the circuit board can be reduced.

According to a further aspect of the present invention the encapsulation element is glued or printed on the surface of the dielectric substrate on top of the conducting traces. It is an advantage of a thus constructed circuit board that the production costs of such a circuit board can be lowered due to the utilization of commonly available production techniques for circuit boards.

According to a further aspect of the present patent application, the dielectric substrate has a further surface opposed to the surface including the trace, wherein the further surface is covered with a ground plane. It is an advantage of a thus constructed circuit board that it provides an easily connectable ground layer.

BRIEF DESCRIPTION OF THE DRAWINGS

Preferred embodiments of the present invention will be discussed in more detail below with reference to the accompanying drawings. They show.

DESCRIPTION OF PREFERRED
EMBODIMENTS OF THE INVENTION

It should be noted that the following description of the present invention refers merely exemplarily to an embodiment of the present invention.

Figure 1:
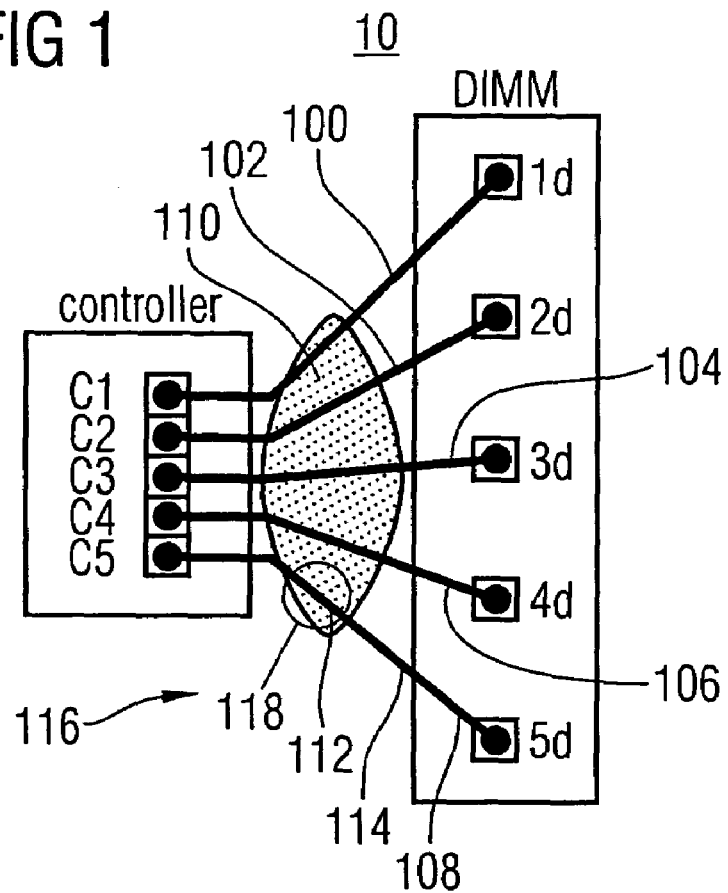
FIG. 1 a top view of a preferred embodiment of an inventive circuit board.

FIG. 1 shows a top view of a circuit board in accordance with an embodiment of the present invention viewed along the normal axis onto a main surface of a substrate of the circuit board, the main surface therefore forming the white background of the figure and generally indicated by the reference number 10. FIG. 1 again shows a controller, as an example of a circuit device, having five pins denoted by the reference signs c1 to c5, a DIMM (DIMM=dual inline memory module) having five pins denoted by the reference signs 1d to 5d. Furthermore, control pin c1 is connected by a first trace 100 with DIMM pin 1d. Controller pin c2 is connected by a second trace 102 with DIMM pin 2d. Controller pin c3 is connected to DIMM pin 3d by a third trace 104 whereas controller pin c4 to DIMM pin 4d by a fourth trace 106 and controller pin c5 is connected to DIMM pin 5d by a fifth trace 108. Between the controller and the DIMM an encapsulation element 110 is positioned or deposited on the surface 10 such that it covers a part of each of said first to fifth traces 100 to 108. To be more specific the fifth trace 108, for example, has a first portion 112 covered by the encapsulation element 110 and a second portion 114 which is not covered by the encapsulation element 110. The encapsulation element 110 is, for example, constructed from a material which has nearly the same effective dielectric constant as the substrate 116 on the surface 10 of which all elements shown in FIG. 1 are arranged. As the encapsulation element 110 has the form of a convex lens, as shown in FIG. 1, a trace which is crossing under the encapsulation element 110 in the middle of this element has a larger (first) portion covered by the encapsulation element 110 as a trace which crosses under the encapsulation element in a region where the encapsulation element 110 has a lower width. This can be exemplarily shown with respect to the third trace 104 connecting controller pin c3 with DIMM pin 3d and the fifth trace 108 connecting controller pin c5 with DIMM pin 5d. As the third trace 104 connecting controller pin c3 with DIMM pin 3d directly crosses under the encapsulation element 110 in the middle, the encapsulation element 110 covers a large part of the third trace 104 connecting controller pin c3 with DIMM pin 3d. Contrary, the encapsulation element 110 only covers a small part of the fifth trace 108 connecting controller pin c5 to DIMM pin 5d. Therefore, a first portion of the third trace 104 connecting controller pin c3 to DIMM pin 3d is larger than a first portion 112 of the fifth trace 108 connecting controller pin c5 to DIMM pin 5d. If an effective dielectric constant of the encapsulation element is higher than for example an effective dielectric constant of a medium extending over the second portions of said traces, a signal propagating along the first portion of the third trace 104 connecting controller pin c3 to DIMM pin 3d has a larger delay than a signal propagating along the first portion 112 of the fifth trace 108 connecting controller pin c5 to DIMM pin 5d. Therefore, it is possible to provide a higher signal delay on the third trace 104 with respect to a signal delay on the fifth trace 108 such that the signals arrived at an equal time at the DIMM pins 3d and 5d. The second medium, having the lower effective dielectric constant than the first medium forming the encapsulation element 110, can for example be normal air, which usually fulfill said relationship of effective dielectric constants. As the encapsulation element has an oval or elliptic shape, as shown in FIG. 1, is can be said that the encapsulation element is formed by a dielectric lens formed on the surface 10 covering the trace shown in FIG. 1.

Figure 2:
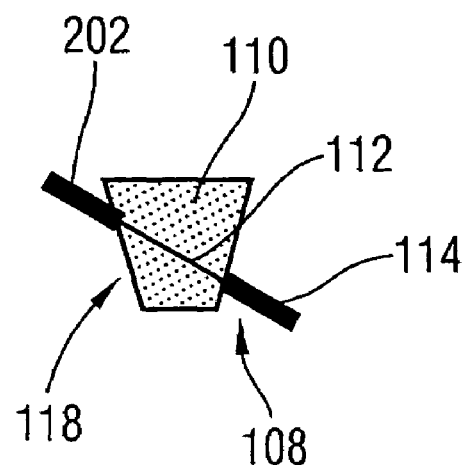
FIG. 2 a top view of a detail of the preferred embodiment of the circuit board according to FIG. 1.

Furthermore, the segment 118 of the fifth trace 108 connecting controller pin c5 with DIMM pin 5d is shown in more detail in FIG. 2.

FIG. 2 shows a top view of the segment 118 of the fifth trace 108 connecting controller pin c5 to DIMM pin 5d as shown in FIG. 1. The fifth trace 108 shown in FIG. 2 comprises the first portion 112 and the second portion 114 wherein the first portion is covered by the encapsulation element 110. As shown in FIG. 2, a sectional width of the first portion 112 of the fifth trace 108 is smaller than a sectional width of the second portion 114 of the fifth trace 108. Thus, a characteristic impedance of all segments 202, 112, 114 equalized and a signal reflection of a signal coming from the controller side end 202 of the fifth trace 108, can be reduced when the signals enters the first portion 112 of the fifth trace 108 having a dielectric material with a higher effective dielectric constant surrounding the first portion 112 of the fifth trace 108. Thus, the signal level of a signal traveling along the fifth trace 108 can be improved as signal reflections are reduced.

Figure 3:
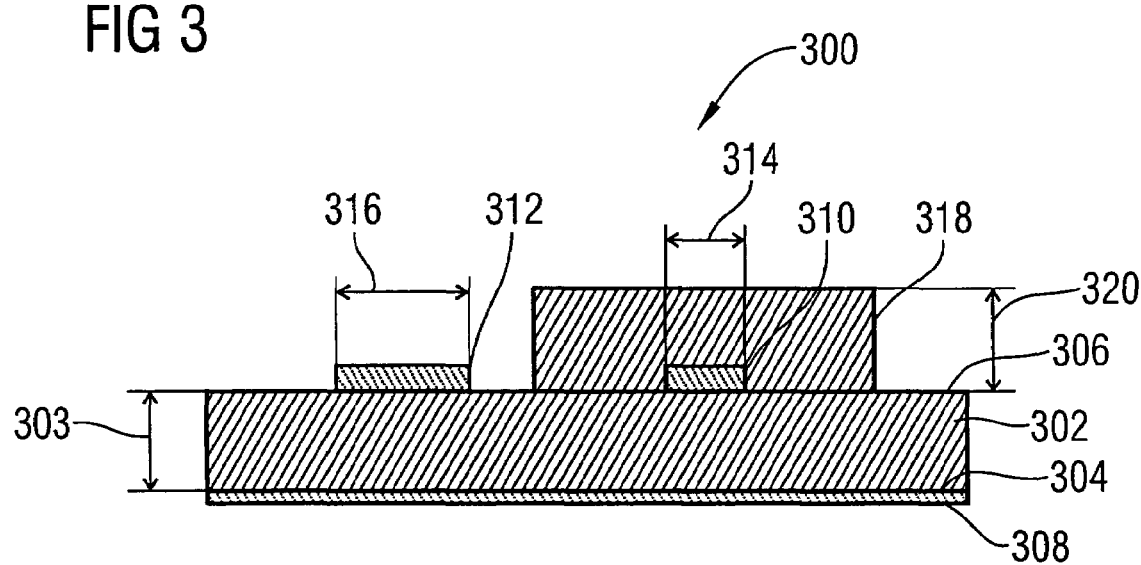
FIG. 3 a cross-sectional side view of a preferred embodiment of the inventive circuit board.
Figure 4:
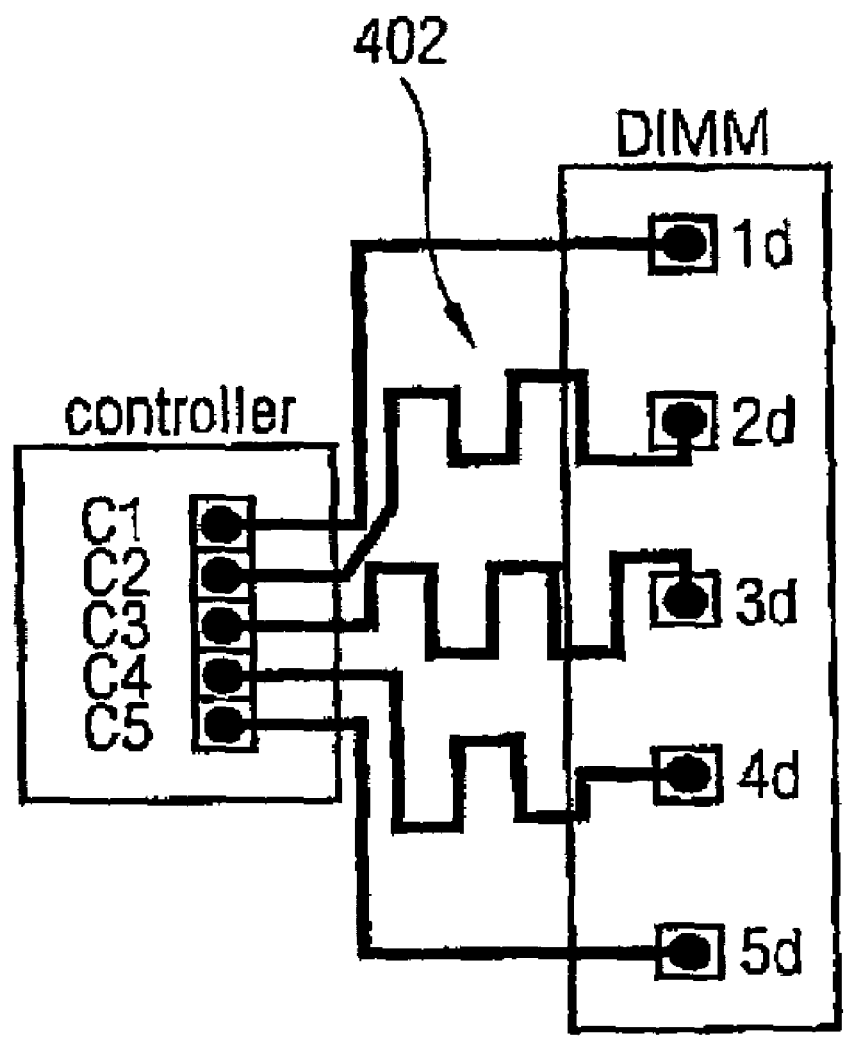
FIG. 4 a top view of a conventional circuit board having meander shaped traces.

FIG. 3 shows a cross-sectional side view of a preferred embodiment of the inventive circuit board. A circuit board 300 comprises a dielectric substrate material 302 having an effective dielectric constant of for example $\epsilon=4.2$. The dielectric substrate 302 has a first main surface 304 and a second surface 306 wherein the first main surface 304 is opposed to the second main surface 306. A ground plane 308 is disposed on the first main surface 304. Furthermore, the dielectric substrate 302 has a height 303 of 0.087 mm. Furthermore, a first trace 310 and a second trace 312 are disposed on the second surface 306 of the dielectric substrate 302. The first trace 310 has a width 314 of 0.06 mm wherein the second trace 312 has a width 316 of 0.1 mm.

Additionally, the first trace 310 is covered by an encapsulation element 318. The encapsulation element 318 preferably is equivalent to the encapsulation element 110 shown in FIGS. 1 and 2. Preferably, the encapsulation element has a height 320 of 0.5 mm and comprises a dielectric material having an effective dielectric constant of for example $\epsilon=4.2$. In the case the encapsulation element 318 is formed like a convex lens in a direction perpendicular to the drawing direction (like the encapsulation element 110 of FIGS. 1 and 2), it can be said, that the encapsulation element 318 is a dielectric lens. Thus, the first trace 310 is covered by the encapsulation element with the effective dielectric constant of $\epsilon=4.2$ wherein the second trace is not covered with such an encapsulation element. Contrary to the structure around the first trace 310, the second trace 312 is surrounded for example by normal air, which has an effective dielectric constant usually being lower than the effective dielectric constant of the encapsulation element 318. For this reason, a signal traveling along the second trace has a higher propagation speed than a signal traveling along the first trace 310 which is covered by the encapsulation element 318. Therefore, it can be said that the second trace 312 is a free running trace (preferably a free running PCB trace) wherein the first trace 310 can be said to be a delayed trace (preferably a delayed PCB trace).

Furthermore, FIG. 3 discloses a different sectional width of the first trace 310 and the second trace 312. As mentioned above, these different sectional widths provide a reduction of signal reflections when the signal is transmitted from a free running trace into a delayed trace portion as for example shown in FIG. 2. Furthermore, it is possible to cover the resulting structure for example with a varnish to protect the elements shown in FIG. 3 against mechanical or chemical influences. However, it is also possible to firstly cover the first trace 310 and the second trace 312 with the varnish and then to cover a portion of the first trace 310 with the encapsulation element 318. In such a case, it is possible to utilize the varnish as a kind of glue material for fixation of the encapsulation element 318 over a portion of the first trace 310. As a layer of varnish mostly is extremely thin and mostly has a different effective dielectric constant than the dielectric substrate 302, the varnish mostly does not influence the electrical features of the first trace 310 and the second trace 312. However, it provides a well predictable electrical behavior of the structure comprising the dielectric substrate 312, the first trace 310 and the encapsulation element 318, the encapsulation element 318 should preferably have the above-mentioned minimum height.

Furthermore, it is possible to provide the encapsulation element by first covering the substrate and the trace by a material of which the encapsulation is to be formed of. Secondly a printing procedure can be used to squeeze out the material at the portions which shall not be covered by the encapsulation element. This results in a structure in which a complete film of the material forming the encapsulation element covers the substrate and the trace and at the portions, in which the encapsulation element is formed, the film of the material has a larger thickness than at the portions in which no encapsulation element is formed. By such a variation of the thickness of the film, a medium forming the encapsulation element at the first portion of the trace has a different effective dielectric constant than a medium extending over the trace at a second portion.

Summarizing it can be said that the preferred approach provides an electrical length matching based on finding that a signal propagation speed in for example a PCB trace depends on effective dielectric permittivity of the board substrate. A piece of dielectric material with for example lens like shape can be glued on the top of the PCB trace as shown in FIGS. 1 and 2. As a result, traces connected to the middle of the DIMM module will mostly propagate via the board area with higher effective dielectric permittivity and as a consequence signals traveling on these traces will have a higher delay per unit length than traces on the edges, which are running along the PCB almost not touching the dielectric lens. If the shape of the lens is calculated properly, all bit traces will have the same electrical length, even if geometrical length is different. To prevent signal reflections and thus signal reductions, the characteristic impedance along the trace should not be changed. Therefore, the trace width under the dielectric lens must be smaller than the trace width not covered by the dielectric lens as shown in FIGS. 2 and 3 of the present patent application. The cross-section of the PCB stack up is shown in FIG. 3. The simulation carried out with respect to a structure according to FIG. 3 provided the result, that a signal delay and a characteristic impedance of the first trace 310 and the second trace 312 are the same (0.7 ns, 60 $\Omega$), when the free running trace (second trace 312) has a length of 127 mm and the delayed trace (first trace 310) has a length of 100 mm. Further dimensions of the structure used for the simulation have been mentioned above in the description of FIG. 3.

The following list of reference numerals corresponds with the drawings.

c1 first pin of the controller
c2 second pin of the controller
c3 third pin of the controller
c4 fourth pin of the controller
c5 fifth pin of the controller
1d first pin of the DIMM
2d second pin of the DIMM
3d third pin of the DIMM
4d fourth pin of the DIMM
5d fifth of the DIMM
100 first trace
102 second trace
104 third trace
106 fourth trace
108 fifth trace
110 encapsulation element
112 first portion of the fifth trace 108
114 second portion of the fifth trace 108
116 dielectric substrate
118 detail portion of the fifth trace 108
202 controller-side of the fifth trace 108
300 circuit board
302 dielectric substrate
303 height of the dielectric substrate 302
304 first main surface of the dielectric substrate 302
306 second main surface of the dielectric substrate 302
308 ground plane
310 first trace
312 second trace 314 width of the first trace 310
316 width of the second trace 312
318 encapsulation element
320 height of the encapsulation element 318
402 meander structures

What is claimed is:

1. A circuit board comprising:
a dielectric substrate;
a trace extending along a surface of the dielectric substrate, the trace having a first and a second portion, the trace being covered by a first medium at the first portion, wherein the first medium is formed by an encapsulation element of a dielectric material so that an effective dielectric constant of the first medium is different from an effective dielectric constant of a second medium extending over the trace at the second portion; and
a second trace extending along the surface of the dielectric substrate, wherein the second trace has a first and a second portion, the first portion of the second trace being covered by a second encapsulation element wherein the second encapsulation element comprises a third medium with an effective dielectric constant being different from the effective dielectric constant of a fourth medium extending over the second portion of the second trace;
wherein the length of the trace is shorter than the length of the second trace and the length of the first portion of the trace is larger than the length of the first portion of the second trace.

2. The circuit board according to claim 1, wherein a width of the first portion of the trace is smaller than a width of the second portion of the trace.

3. The trace according to claim 1, wherein the effective dielectric constant of the first medium is higher than the effective dielectric constant of the second medium.

4. The circuit board according to claim 1, wherein the effective dielectric constant of the first medium is substantially equal to the effective dielectric constant of the dielectric substrate.

5. The circuit board according to claim 1, wherein the first medium and the second medium are located on a side of the trace being opposite to the surface of the dielectric substrate.

6. The circuit board according to claim 1, wherein the second medium comprises gas in the environment of the circuit board.

7. The circuit board according to claim 1, wherein a height of the encapsulation element at the first portion of the trace is equal to or greater than a height between the trace and a ground or supply plane.

8. The circuit board according to claim 1, wherein the second encapsulation element is integrally formed with the encapsulation element formed by the first medium.

9. The circuit board according to claim 1, wherein the second medium corresponds to the fourth medium.

10. The circuit board according to claim 1, wherein the length of the first and second portion of the trace and second trace and the difference between the effective dielectric constant of the first medium and the second medium and between the effective dielectric constant of the third and the fourth medium are adjustable such that the electrical length of the first trace is substantially equal to an electrical length of the second trace.

11. The circuit board according to claim 1, wherein a first terminal of a first electronic component is connected via the trace with a first terminal of a second electronic component and the second terminal of the first electronic component is connected via the second trace with a second terminal of the second electronic component.

12. The circuit board according to claim 1, further comprising:
a third trace extending along the surface of the dielectric substrate, the third trace having a first and a second portion, the third trace being covered by a third encapsulation element wherein the third encapsulation element comprises a fifth medium with an effective dielectric constant being different from the effective dielectric constant of a sixth medium extending over the second portion of the third trace.

13. The circuit board according to claim 12, wherein the third encapsulation element is integrally formed with the encapsulation element formed by the first medium.

14. The circuit board according to claim 12, wherein a length of the first portion of the trace is longer than a length of the first portion of the third trace and wherein the first portion of the trace is located in between the first portion of the second trace and the first portion of the third trace.

15. The circuit board according to claim 1, wherein the encapsulation element has the form of a convex lens.

16. The circuit board according to claim 1, wherein the encapsulation element is glued or printed on the surface of the dielectric substrate.

17. The circuit board according to claim 1, wherein the dielectric substrate has a further surface opposed to the surface along which the trace extends, wherein the further surface is covered with a ground plane comprising a metal material.

18. The circuit board according to claim 1, wherein the first portions of the trace and the second trace are straight.

19. The circuit board of claim 1 in combination with at least one semiconductor chip, the semiconductor chip mounted on the circuit board and electrically coupled to the trace and to the second trace.

20. A circuit board comprising:
a dielectric substrate;
a first trace extending along a surface of the dielectric substrate, the first trace having a first physical length and a first electrical length;
an encapsulating material overlying at least a portion of the first trace, the encapsulating material affecting an electrical characteristic of the first trace; and
a second trace extending along a surface of the dielectric substrate, the second trace having a second physical length and a second electrical length, wherein the second physical length is different than the first physical length and wherein the first electrical length is substantially equal to the second electrical length.

21. The circuit board of claim 20 and further comprising a second encapsulating material overlying at least a portion of the second trace.

22. The circuit board of claim 20 in combination with at least one semiconductor chip, the semiconductor chip mounted on the circuit board and electrically coupled to the first trace and to the second trace.

* * * * *